(12) United States Patent
Eissler

(10) Patent No.: US 8,427,839 B2
(45) Date of Patent: Apr. 23, 2013

(54) ARRANGEMENT COMPRISING AN OPTOELECTRONIC COMPONENT

(75) Inventor: Dieter Eissler, Nittendorf/Etterzhausen (DE)

(73) Assignee: OSRAM Opto Semiconductors GmbH (DE)

( * ) Notice: Subject to any disclaimer, the term of this patent is extended or adjusted under 35 U.S.C. 154(b) by 342 days.

(21) Appl. No.: 12/678,511

(22) PCT Filed: Sep. 9, 2008

(86) PCT No.: PCT/DE2008/001513
§ 371 (c)(1),
(2), (4) Date: Apr. 12, 2010

(87) PCT Pub. No.: WO2009/039825
PCT Pub. Date: Apr. 2, 2009

(65) Prior Publication Data
US 2010/0214727 A1 Aug. 26, 2010

(30) Foreign Application Priority Data

Sep. 28, 2007 (DE) .................. 10 2007 046 720
Nov. 12, 2007 (DE) .................. 10 2007 053 849

(51) Int. Cl.
*H05K 7/10* (2006.01)
(52) U.S. Cl.
USPC ........................... 361/770; 361/760; 361/790
(58) Field of Classification Search .......... 361/770–790
See application file for complete search history.

(56) References Cited

U.S. PATENT DOCUMENTS

| 3,657,610 | A | 4/1972 | Yamamoto et al. |
| 3,811,186 | A | 5/1974 | Larnerd et al. |
| 5,684,677 | A * | 11/1997 | Uchida et al. ............... 361/770 |
| 5,931,371 | A * | 8/1999 | Pao et al. ............... 228/180.22 |
| 2001/0010743 | A1 | 8/2001 | Cayrefourcq et al. |
| 2005/0259912 | A1* | 11/2005 | Fukuyama et al. ............ 385/14 |
| 2006/0118800 | A1 | 6/2006 | Kim |

FOREIGN PATENT DOCUMENTS

| DE | 40 20 048 A1 | 1/1992 |
| DE | 101 57 205 A1 | 6/2003 |
| DE | 20 2005 014 073 U1 | 2/2007 |
| EP | 0 631 461 A1 | 12/1994 |
| EP | 1 398 839 A1 | 3/2004 |
| EP | 1 469 516 A1 | 10/2004 |
| JP | 06-120225 A | 4/1994 |
| JP | 07-074450 A | 3/1995 |
| JP | 2002-319705 A | 10/2002 |
| JP | 2004-264362 A | 9/2004 |
| JP | 2004-336078 A | 11/2004 |
| JP | 2005-012155 A | 1/2005 |
| JP | 2006-165542 A | 6/2006 |
| JP | 2008-066454 A | 3/2008 |
| WO | 2004/105142 A1 | 12/2004 |
| WO | 2005/067063 A1 | 7/2005 |
| WO | 2007/028541 A1 | 3/2007 |

* cited by examiner

*Primary Examiner* — Tuan T Dinh
(74) *Attorney, Agent, or Firm* — DLA Piper LLP (US)

(57) ABSTRACT

An arrangement includes an optoelectronic component with two contacts; at least one further component part; at least one contact arranged between the optoelectronic component and the further component part; and at least one web arranged between the optoelectronic component and the further component part.

16 Claims, 3 Drawing Sheets

ARRANGEMENT COMPRISING AN OPTOELECTRONIC COMPONENT

RELATED APPLICATIONS

This is a §371 of International Application No. PCT/DE2008/001513, with an international filing date of Sep. 9, 2008 (WO 2009/039825 A1, published Apr. 2, 2009), which is based on German Patent Application Nos. 10 2007 046 720.8, filed Sep. 28, 2007, and 10 2007 053 849.0, filed Nov. 12, 2007, the subject matter of which is incorporated by reference.

TECHNICAL FIELD

This disclosure relates to an arrangement comprising an optoelectronic component with two contacts and at least one further component part, wherein at least one contact is arranged between the optoelectronic component and the further component part.

BACKGROUND

The contact-connection between an optoelectronic component and a further component part is usually effected by means of bonding connection using so-called "wire bonds," that is to say that a wire connection is produced between the optoelectronic component and the further component part.

In the case of contacts directly between the optoelectronic component and the further component part, it is also possible to integrally form so-called "stud bumps," that is to say solder reservoirs at the contacts either of the optoelectronic component or of the further component part and to weld these during mounting by ultrasound or hot soldering or a combination of both.

A further possibility is also the adhesive bonding of the contacts using conductive adhesive. Likewise, it is also known to produce the contacts by soldering connections on the basis of solder bump technology using soldering resists or suitably structured films.

In the case of all previously known techniques for contact-connecting an electronic component to a further component part, problems still arise particularly in mass production, in respect of obtaining optimum contact-connection with minimum rejects.

Therefore, it could be helpful to provide a means of which the contact-connection between an electronic component and a further component part can be reliably obtained.

SUMMARY

I provide an arrangement including an optoelectronic component with two contacts; at least one further component part; at least one contact arranged between the optoelectronic component and the further component part; and at least one web arranged between the optoelectronic component and the further component part.

BRIEF DESCRIPTION OF THE DRAWINGS

My arrangements and advantageous configurations are explained in greater detail below on the basis of some examples illustrated in the drawings.

DETAILED DESCRIPTION

Figure 1:
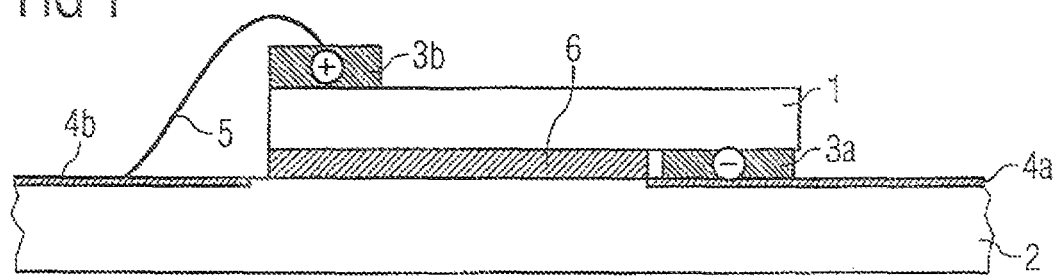
FIG. 1 shows a schematic side view of an optoelectronic component mounted on a further component part with an intervening contact area and a web.

I provide at least one web arranged between the optoelectronic component and the further component part. By means of the web, a defined mounting position is obtained during mounting of the optoelectronic component on the further component part. This makes it possible, even in mass production, for the optoelectronic component and the further component part always to be positioned with respect to one another in such a way that the desired optimum contact-connection is achieved.

In a further configuration, the web is arranged directly alongside the contact and bridges the entire region alongside the contact between the optoelectronic component and the further component part.

The web thus serves not only to define the mounting position, but also for height compensation alongside the projecting contact at the optoelectronic component.

Bridging the entire region alongside the contact areas between the optoelectronic component and the further component part also results in significantly better heat conduction between the optoelectronic component and the further component part.

In one example, both contacts are arranged between the optoelectronic component and the further component part and the web is positioned between the contacts of the optoelectronic component.

This type of coupling is suitable, in particular, for the coupling of a flip-chip component, such as, for example, of a monolithic diode of CSP embodiment (CSP=chip scale package), in which at least two contacts are arranged on one side.

Arrangement of a web between two contacts has, along with the advantages of the precise definition of the mounting position and the increased heat conduction, the further function that the web serves to avoid short circuits.

The web between the two contacts avoids a situation in which, during contact-connection, the solder or the adhesive or splashes of the solder or of the adhesive flow to the other contact area and, consequently, short-circuit connections are prevented as early as during construction.

Likewise, the temporal endurance of the connection is also increased since harmful material creep of the insulated contact connections is prevented. Particularly in long-term operation, in the case of DC applications under the influence of adverse environmental conditions, harmful material creep cannot be precluded, which is suppressed by the web between the contacts.

The web can be embodied at the optoelectronic component, at the further component part or else in combined fashion at the optoelectronic component and the further component part.

It is also possible for a plurality of webs to be arranged between the optoelectronic component and the further component part, the plurality of webs being defined in part at the optoelectronic component and in part at the further component part.

The further component part can be a so-called "submount," on which the optoelectronic component is contact-connected, or else a further optoelectronic component.

In another example, the web can be arranged between the contacts at the optoelectronic component and the optoelectronic component can be mounted on a further carrier in such a way that the contacts face away from the further carrier. In this example, the contacts are contact-connected, e.g., by wire connections, so-called "wire bonds."

The increased heat dissipation by the web is beneficially manifested particularly when optoelectronic components are stacked one above another. A power loss of between 1 and 5 watts is produced in the case of an optoelectronic component, e.g., in the case of power diodes, and even more than 10 watts in the case of optoelectronic modules. When optoelectronic components are stacked one above another, bunching of the heat sources occurs and, consequently, dissipation of the heat loss is a central aspect. If the heat loss is not dissipated, the service life of optoelectronic components decreases drastically.

In accordance with a further example, the web is embodied in such a way that a self-alignment of the optoelectronic component with respect to the further component part is effected during mounting.

For this purpose, insertion bevels are expediently formed at the web and respectively at the contact or contacts, with the result that when the optoelectronic component is brought together with the further component part the insertion bevel or the insertion bevels take effect in such a way that a precise alignment of the position between the optoelectronic component and the further component part is obtained.

This type of self-alignment leads to a great simplification of the contact-connection between optoelectronic component and further component part.

The self-alignment is particularly advantageous in the case of die bonding and, as a result, so-called "tape die bonds" in the assemblage are also possible, in the case of which a multiplicity of optoelectronic components connected to one another by tape can be contact-connected to the further component parts simultaneously or in specific cyclic steps. This results in implementation of extremely tiny electronic components with a self-alignment mechanism.

Along with the self-alignment, the web is preferably embodied such that it is electrically insulating and conducts heat well, with the result that, along with the self-alignment, avoidance of short circuits is also obtained and, as a result of increased heat dissipation, avoidance of hot spots is also obtained.

In accordance with one example, the regions between the optoelectronic component and the further component part which are not used for electrical contact-connection, that is to say are not adhesively bonded, not soldered or not welded, are at least partly roughened.

The partial roughening gives rise to a direct mechanical contact, whereby heat conduction is increased. The contact can be supported by addition of filling material or thermally conductive pastes.

Preferably, the filling material or thermally conductive paste is applied to the webs on the end side, that is to say at the regions of the web on which the optoelectronic component is pressed during mounting to simultaneously serve as tolerance compensation. For this purpose, it is expedient for the filling material or thermally conductive paste to have at least slightly elastic properties.

Particularly in the configuration of the optoelectronic component as a substrateless flip-chip component, heat transfer from the component into the substrate, that is to say the further component part is critical. The roughened contact and also the filling material and the thermally conductive paste optimize the heat transfer from the component into the substrate, with the result that a thermal failure owing to locally excessively high thermal resistance in the insulation region between the two contacts is extensively delayed or completely avoided. As a result of the increased thermal conductivity by arrangement of the web, components in the highest power class can thus be realized, with the additional advantage that sensitive and expensive bonding wires can likewise be obviated.

In accordance with one preferred example, the web is embodied with an extremely high melting point, in non-wetting fashion and with a specific surface geometry and boundary.

In a further example, points and edges in the arrangement are avoided as far as possible by means of the web to increase the ESD strength (ESD=electrostatic discharge). Furthermore, it is expedient for the sides of the web or the end area to be configured in an undulatory fashion. As a result of an undulatory configuration of the sides of the web or of the end area, creep of solder materials, in particular, is made considerably more difficult. The undulation can advantageously be formed by utilizing standing waves during curing of vertical photoresist structures.

The undulatory example is likewise advantageous at the further component part, generally the submount, in the regions that do not make contact.

The web is expediently produced from one of the following materials or a combination of the following materials: molybdenum, tantalum, aluminum, aluminum nitrite, copper, alloys, titanium nitrite passivated, tungsten nitrite and titanium-tungsten nitrite, gold, silver, passivated electrical conductors, dielectrics, diamond, diamond-like substances, plastics or electrically insulating transparent material.

One material or the other can be advantageous depending on the intended main feature. Multiple combinations of the aforementioned materials to compensate for the critical thermal expansion can likewise be expedient.

The example of the webs as transparent material has the advantage that a transparent stack can be constructed by the webs, which do not necessarily effect connection, in the case of semiconductor luminous means or detectors of this type.

In accordance with one example, there is a free region without direct contact between the optoelectronic component and the further component part in the mounted state.

For the purpose of thermal matching, it may be expedient in an individual case to leave free very small regions that are non-critical for the purpose of heat distribution and fill them with an elastic material, with the result that cracks or other undesired properties caused by mechanical stress are reliably suppressed. The free regions between the optoelectronic component and the further component part impart a certain elasticity to the entire arrangement, thereby reducing the risk of being damaged on account of mechanical action.

Another example provides for two or more optoelectronic components to be stacked one above another. In this case, the optoelectronic components can be configured such that they are congruent or else different in size. In this example, the optoelectronic components are advantageously contact-connected to one another by so-called "vias," that is to say through holes filled with contact material.

By means of these optoelectronic components stacked one above another, it is possible to produce red, green, blue modules, for example, which emit radiation through one another or past one another. In this case, the color can be set optimally in the far field.

A further example provides for the web to be embodied asymmetrically. A so-called "coding" is obtained as a result, such that the optoelectronic component cannot be mounted onto the further component part incorrectly and, consequently, the polarity is safeguarded. In the case of erroneous mounting, the incorrectly mounted component parts are immediately conspicuous since they have an altered and hence atypical external symmetry.

Turning now to the Drawings, elements having the same function are provided with the same reference symbols throughout the figures hereinafter.

FIG. 1 shows a schematic side view of an optoelectronic component 1, which is connected to a further component part 2. The optoelectronic component is generally embodied as a radiation-emitting component, which emits the radiation upward in accordance with FIG. 1.

The structure can be chosen to be substrateless, for example, as a monolithic diode or by the arrangement of a semiconductor chip on a carrier body.

In the example in accordance with FIG. 1, the optoelectronic component has two contacts 3a, 3b, wherein one contact 3a is arranged between the optoelectronic component 1 and the further component part 2, such that contact 3a contacts a contact 4a at the further component part 2.

The further contact 3b of the optoelectronic component 1 is arranged at the top side and connected to a further contact 4b of the further component part 2 by a bonding wire 5.

A web 6 is arranged in the region between the optoelectronic component 1 and the further component part 2 which is not used for the contact-connection of the contacts 3a, 4a, the height of the web being configured in such a way that the web bridges the height of the contact 3a at the optoelectronic component 1. The web 6 first serves to define the mounting position between the optoelectronic component 1 and the further component part 6 and also for improved heat conduction from the optoelectronic component 1 into the further component part 2.

The further component part 2 can be a support such as a submount or else a further component, in particular, also a further optoelectronic component.

The web 6 need not be embodied in one piece, but rather can also be constructed from a plurality of partial webs and can also be beveled in the region with respect to the contact 3a to obtain an insertion bevel (depicted in dashed fashion) for mounting.

Figure 2:
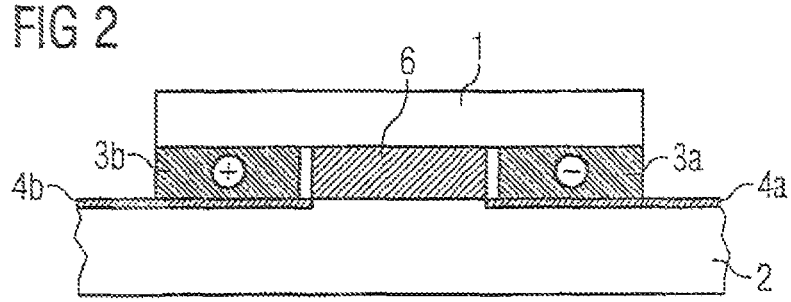
FIG. 2 shows a schematic side view of an optoelectronic component mounted on a further component part with two contact regions and an intervening web.

FIG. 2 shows an arrangement similar to that of FIG. 1, wherein both contacts 3a and 3b of the optoelectronic component 1 are arranged on the underside, that is to say in the region between the optoelectronic component 1 and the further component part 2.

This example of the optoelectronic component 1 is found, in particular, in the case of flip-chip components, for example, a monolithic diode in the chip scale package (CSP).

The web 6 in this case is arranged between the two contacts 3a and 3b and therefore defines even more clearly the mounting position between the optoelectronic component and the further component part 2. The web 6 need not necessarily be arranged at the further component part 2, but rather can likewise also be fixed to the optoelectronic component 1.

The contact-connection between the contacts 3a, 4a and, respectively, 3b, 4b is effected in a conventional manner by means of solder or conductive adhesive.

As a result of the arrangement of the web 6 between the contact regions 3a, 4a and 3b, 4b, the web 6 also helps avoid short circuits, since, during mounting, the solder is also prevented from flowing from the contact region 3a, 4a to the contact region 3b, 4b. Even over a relatively long time, creep of the solder from one contact region to the other is made considerably more difficult or completely avoided by means of the web 6.

Figure 3:
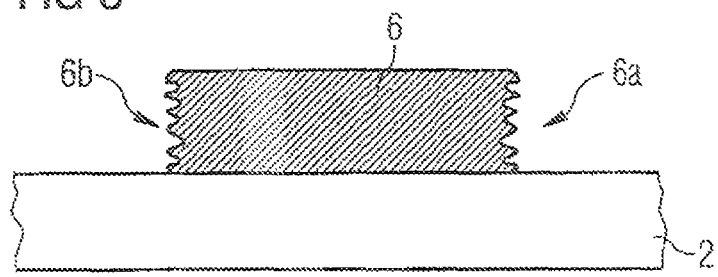
FIG. 3 schematically shows the web with a roughened side area.

FIG. 3 shows the web 6 with lateral flanks 6a and 6b embodied in undulatory fashion. These undulatory lateral flanks or side areas additionally prevent solder creep over the service life of such a component and thus contribute to avoiding creepage current. The undulatory side areas can be produced by standing waves and the choice of suitable photoresist thicknesses.

Furthermore, a better mechanical contact is obtained by the undulatory surface, as a result of which the heat conduction from the optoelectronic component 1 via the contact regions 3a, 3b into the web 6 is also increased.

Figure 4:
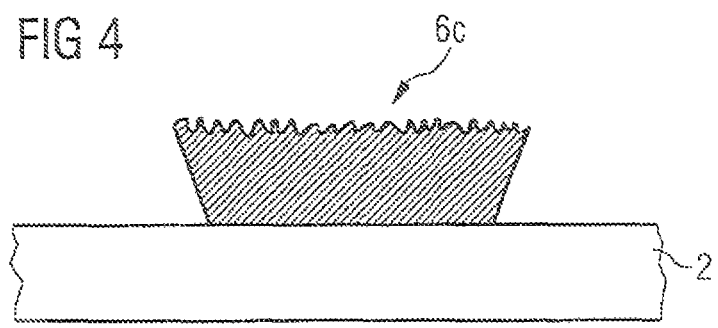
FIG. 4 schematically shows the web with a roughened end area.

In this respect, FIG. 4 shows, likewise in isolation, the web 6 on the further component 2, wherein, in accordance with this example, the web 6 is roughened at its surface 6c to obtain a better mechanical contact and thus to obtain better heat conduction. The production of a roughened surface 6c such as is illustrated in FIG. 4 can be produced by grinding, for example. The heat conduction can be increased by thermally conductive pastes or fillers.

The roughened surface 6c in conjunction with the thermally conductive paste has the advantage of an ideal thermal contact with at the same time the advantage of avoiding the risk of mechanical stress being introduced into the optoelectronic component 1 by means of the web 6 during the production of the contact in the contact regions 3a, 4a and, respectively, 3b, 4b.

Figure 5:
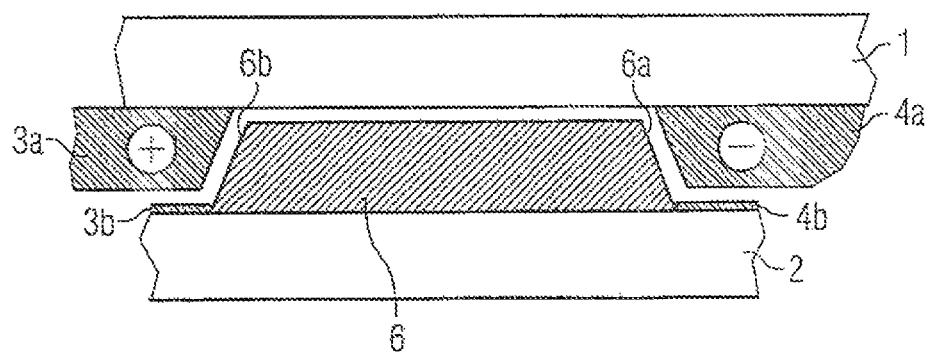
FIG. 5 shows, in principle, the illustration in accordance with FIG. 2 with insertion bevels at the web and also at the contacts.

FIG. 5 shows, in principle, the example in accordance with FIG. 2, wherein here the web 6 is beveled at the side flanks 6a and 6b and the contacts 4a, 4b are likewise embodied in beveled fashion at the flanks lying opposite. This example results in particularly good self-alignment. In the case, for example, of 50 to 70 μm wide contact flanks 3a and 4a and a width of the web 6 of <100 μm, standard equipment can be used for production. When special equipment is used, it is possible to realize extremely narrow contact interspaces, that is to say extremely narrow webs 6 with a correspondingly larger contact area in the contact regions 3a, 3b and 4a, 4b and, hence, also an increased heat transfer.

Figure 6:
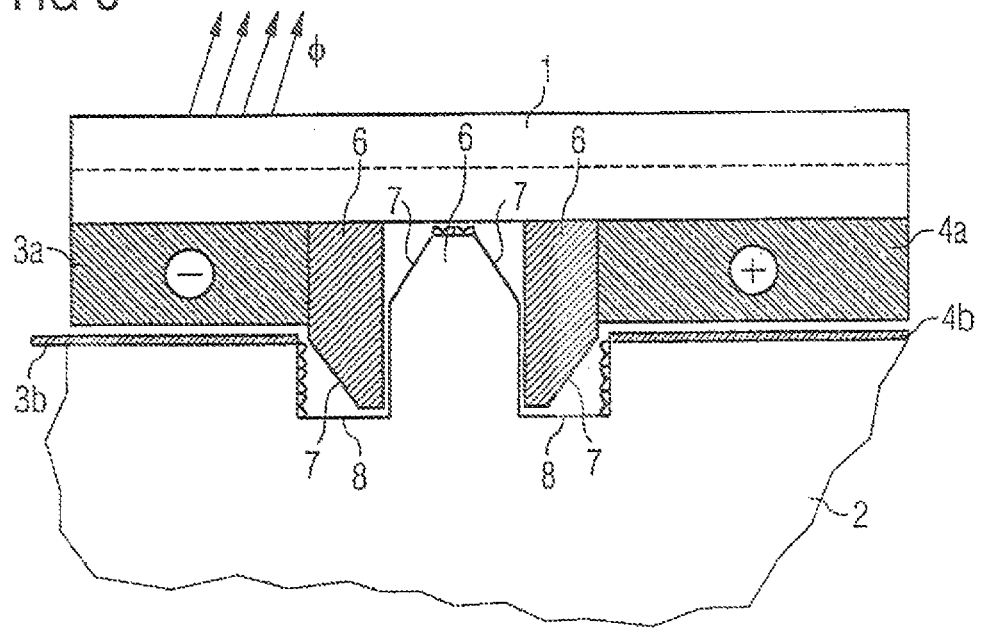
FIG. 6 shows, in schematic side view, an optoelectronic component mounted on a further component part with two webs at the optoelectronic component and a web arranged therebetween at the further component part.

FIG. 6 shows an example with three webs 6, wherein two webs are formed at the optoelectronic component 1 and the middle web 6 is formed at the further component part 2, a submount in this case.

In this case, the optoelectronic component 1 is embodied as a light-emitting diode that emits light upward in the arrow direction.

The webs 6 at the optoelectronic component 1 are embodied laterally with respect to the contacts 3a and 4a and serve both for insulation and for centering. In this example, the webs 6 arranged at the optoelectronic component 1 are embodied such that they project beyond the underside of the contact areas 3a and 4a. The submount, or that is to say the further component part 2 has corresponding cutouts 8 in this region, into which cutouts the projecting part of the webs 6 engages. For the purpose of centering, these webs have insertion bevels 7 at the outer sides, by which insertion bevels an exact self-alignment is obtained during mounting. The middle web 6, defined at the submount 2, likewise has insertion bevels 7 in each case at the upper side edges, with the result that the two outer webs 6 connected to the optoelectronic component 1 are also guided exactly by the insertion bevels 7.

In the cutout 8, the side walls below the contacts 3a and 4a are embodied in undulatory fashion to avoid creepage current.

The surface of the middle web 6, connected directly to the submount or the further component part 2, is likewise embodied in roughened fashion to obtain an optimum heat transfer between the optoelectronic component 1 and the middle web 6 in the mounted state.

Figure 7:
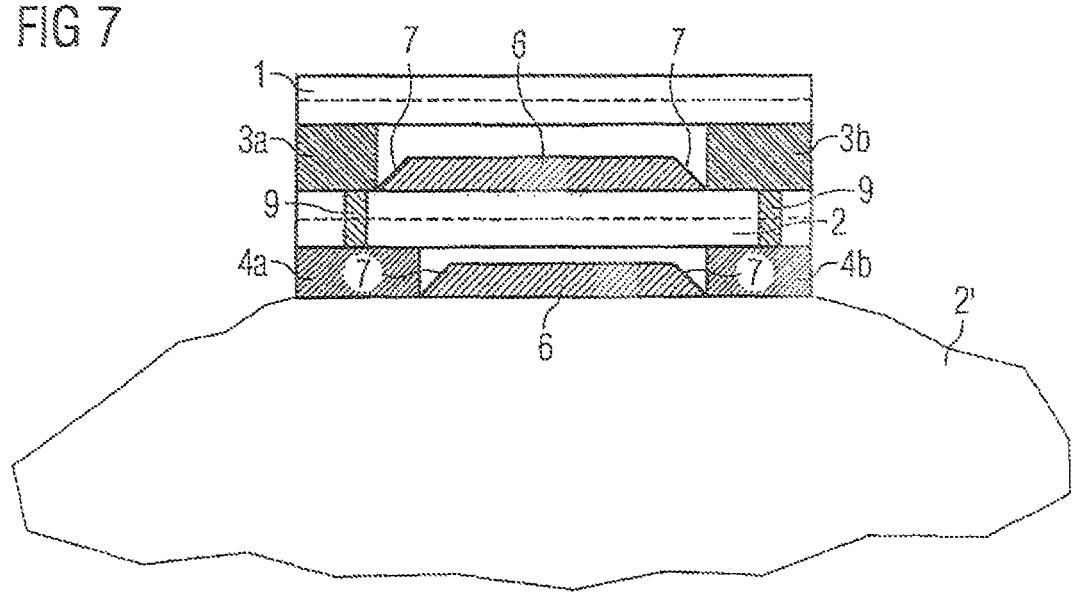
FIG. 7 shows, in schematic side view, a stack of two optoelectronic components mounted on a submount with webs respectively arranged between the contact regions.

FIG. 7 shows a further example of two optoelectronic components being stacked one above the other. The further component part 2 is therefore likewise embodied as an optoelectronic component and the web 6 is arranged at the top side of the further optoelectronic component 2 to receive the upper optoelectronic component 1 in a mechanically centered manner by contacts 3a and 3b and also to obtain avoidance of short circuits between the two contacts 3a and 3b.

The two optoelectronic components 1 and 2 are contact-connected to one another by so-called "vias" 9, that is to say through holes filled with solder. Both at the upper web 6 and in the lower web 6, the flanks are laterally beveled and insertion bevels 7 are thereby formed.

The further optoelectronic component 2 is functionally appropriately contact-connected to the submount 2' arranged underneath. This contact-connection is not illustrated in more specific detail and can be realized, for example, by an insulated plated-through hole or T contact or by means of CPHF (CPHF=compact planar high flux) technology or other appropriate connections.

The optoelectronic component 1 and the optoelectronic component 2, which constitutes the further component part are, for example, respectively a blue and yellow light-emitting diode or a transmitter-detector pair for the functional supervision of the transmitter.

By way of example, the following realization can be particularly expedient. The submount 2' is embodied as a so-called "module submount" using CPHF technology. The component 2 arranged thereabove is embodied as a stable blue CSP LED with through-plating and with an integrated frontal transparent web and also contacts at the top side. Arranged thereabove is the component 1, a substrateless yellow diode which is a few μm thick and is transparent to blue light and which has through-plating or is possibly contact-connected by means of conventional wire bonding.

Overall, the web affords a large number of advantages. The heat conduction is improved, the risk of short circuits is reduced, and there is self-alignment during mounting and increased stability. A smaller structural size of the arrangement can be obtained as a result of these advantages.

As a result of the transparency of the webs, many novel forms of application can be realized and, as a result of the lateral example of insertion bevels at the webs, the connection in the case of components stacked one above another can be realized significantly more simply.

The example of the webs between the contact regions also increases the ESD compatability since sharp edges and pointed designs are avoided.

As a result of the use of materials that normally are not appropriate in respect of the thermal expansion in the web region, it is possible to obtain a higher heat dissipation and thus an increase in the performance of the entire arrangement. The increased heat dissipation reduces the operating temperature as a result of which even smaller designs can be realized. Furthermore, savings also arise in the case of additional heat sinks that are otherwise required. As a result of the self-alignment and centering, automatic machines that are more cost-effective and faster and do not operate as precisely can be used during construction or during production.

Figure 8:
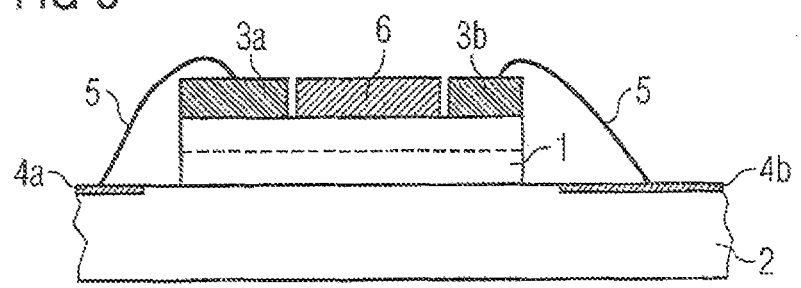
FIG. 8 shows a further example, in accordance with which the optoelectronic component is arranged with the contacts and the web lying oppositely from the further component part.

FIG. 8 shows a further example with the optoelectronic component 1 being mounted onto a further component 2 in such a way that the contacts 3a and 3b face upward. The contacts 3a and 3b are contact-connected to further contacts 4a and 4b of the further component part 2 by a conventional bonding wire. The web 6 between the contacts 3a and 3b here serves firstly for better heat dissipation and secondly for avoiding short circuits during the contact-connection of the bonding wires 5, and also for avoiding short circuits on account of the creep properties of the solder.

This example is suitable for use in illuminating the exterior façade of houses or other objects in the open where the observer sees the optoelectronic component only from a distance. The light emission of the optoelectronic component can be effected either through the web 6 embodied in transparent fashion, or else laterally.

This disclosure is not restricted to the examples illustrated. Thus, in particular, all of the features disclosed with respect to the examples can also be combined to form new structures within the scope of protection of the appended claims.

The invention claimed is:

1. An arrangement comprising:
   an optoelectronic component with two contacts;
   at least one further component part;
   at least one contact arranged between the optoelectronic component and the further component part; and
   at least one web arranged between the optoelectronic component and the further component part,
   wherein
   1) the web defines a mounting obtained during mounting of the optoelectronic component on the further component part, and
   2) the web is beveled at side flanks and the contacts are beveled at flanks lying opposite said side flanks of the web such that, when the optoelectronic component is brought together with the further component part, an alignment of a position between the optoelectronic component and the further component part is obtained.

2. The arrangement as claimed in claim 1,
   wherein
   the web is arranged directly alongside the contact and bridges a region alongside the contact between the optoelectronic component and the further component part.

3. The arrangement as claimed in claim 1,
   wherein
   both contacts are arranged between the optoelectronic component and the further component part and the web is arranged between the contacts of the optoelectronic component.

4. The arrangement as claimed in claim 1,
   wherein
   the web is arranged at the optoelectronic component or at the further component part or a plurality of webs are arranged in a combination at the optoelectronic component and the further component part.

5. The arrangement as claimed in claim 1,
wherein
the further component part is a submount or a further optoelectronic component.

6. The arrangement as claimed in claim 1,
wherein
the web is configured geometrically such that self-alignment is effected during mounting.

7. The arrangement as claimed in claim 1,
wherein
contact regions between the optoelectronic component and the further component part which are not adhesively bonded, not soldered or not welded are at least partly roughened.

8. The arrangement as claimed in claim 1,
wherein
contact regions between the optoelectronic component and the further component part which are not adhesively bonded, not soldered or not welded are at least partly provided with filling material and or a thermally conductive paste.

9. The arrangement as claimed in claim 1,
wherein
the web is produced from a material having a high melting point.

10. The arrangement as claimed in claim 1,
wherein
the web is produced from one or more of the materials selected from the group consisting of molybdenum, tantalum, aluminum, aluminum nitrite, copper, alloys, titanium nitrite passivated, tungsten nitrite, titanium-tungsten nitrite, gold, silver, passivated electrical conductors, dielectrics, diamond, diamond-like substances, plastics and electrically insulating transparent material.

11. The arrangement as claimed in claim 1,
further comprising a free region without direct contact between the optoelectronic component and the further component part.

12. The arrangement as claimed in claim 1,
wherein
two or more optoelectronic components are stacked one above another, 13. The arrangement as claimed in claim 12,
wherein
the optoelectronic components are congruent or different in size.

14. The arrangement as claimed in claim 12,
wherein
the optoelectronic components are contact-connected to one another by plated-through holes.

15. The arrangement as claimed in claim 1,
wherein
the web is asymmetric, such that a coding arises and polarity is safeguarded during mounting.

16. The arrangement as claimed in claim 13,
wherein
the optoelectronic components are contact-connected to one another by plated-through holes.

* * * * *

UNITED STATES PATENT AND TRADEMARK OFFICE
CERTIFICATE OF CORRECTION

| | | |
|---|---|---|
| PATENT NO. | : 8,427,839 B2 | |
| APPLICATION NO. | : 12/678511 | |
| DATED | : April 23, 2013 | |
| INVENTOR(S) | : Dieter Eissler | |

It is certified that error appears in the above-identified patent and that said Letters Patent is hereby corrected as shown below:

In the Claims

<u>In Column 9</u>

At Claim 8, line 20, change "and or" to -- and/or --.

Signed and Sealed this
Twenty-fifth Day of June, 2013

Teresa Stanek Rea
*Acting Director of the United States Patent and Trademark Office*